(12) United States Patent
Beck (10) Patent No.: US 8,156,637 B2
(45) Date of Patent: Apr. 17, 2012

(54) APPARATUS FOR FORMING HTS CONTINUOUS CONDUCTOR ELEMENTS

(75) Inventor: Peter Joseph Beck, Auckland (NZ)

(73) Assignee: General Cable Superconductors Limited

( * ) Notice: Subject to any disclaimer, the term of this patent is extended or adjusted under 35 U.S.C. 154(b) by 1059 days.

(21) Appl. No.: 11/962,368

(22) Filed: Dec. 21, 2007

(65) Prior Publication Data

US 2010/0263198 A1    Oct. 21, 2010

Related U.S. Application Data

(60) Provisional application No. 60/871,191, filed on Dec. 21, 2006.

(51) Int. Cl.
*B23P 19/00* (2006.01)
(52) U.S. Cl. ............ 29/745; 29/599; 29/825; 174/125.1
(58) Field of Classification Search .................... 29/599, 29/825, 745; 174/125.1
See application file for complete search history.

(56) References Cited

U.S. PATENT DOCUMENTS

| | | | | |
|---|---|---|---|---|
| 2,249,509 | A * | 7/1941 | Welch, Jr. et al. | 174/34 |
| 2,986,176 | A * | 5/1961 | West | 140/71 R |
| 3,000,406 | A * | 9/1961 | West | 140/71 R |
| 4,304,033 | A * | 12/1981 | Sakaue et al. | 29/33 F |
| 4,329,764 | A * | 5/1982 | Sakaue et al. | 29/33 F |
| 5,331,800 | A * | 7/1994 | Schaumburg et al. | 57/311 |
| 6,327,772 | B1 * | 12/2001 | Zadno-Azizi et al. | 29/557 |
| 6,725,071 | B2 | 4/2004 | Albrecht et al. | |
| 7,698,804 | B2 * | 4/2010 | Leghissa | 29/599 |
| 2002/0050057 | A1 | 5/2002 | Spichal | |
| 2003/0024818 | A1 | 2/2003 | Albrecht et al. | |
| 2005/0227873 | A1 | 10/2005 | Leghissa | |
| 2008/0210454 | A1 * | 9/2008 | Fee et al. | 174/125.1 |

FOREIGN PATENT DOCUMENTS

| | | |
|---|---|---|
| JP | 2003-092033 | 3/2003 |
| JP | 2003-331659 | 11/2003 |
| JP | 2004-090967 | 1/2004 |
| WO | WO-03/100875 | 12/2003 |
| WO | WO-2005/096322 | 10/2005 |

OTHER PUBLICATIONS

M N Wilson, "Superconductors and accelerators: the Good Companions", IEEE Transactions on Applied Superconductivity, vol. 9, No. 2, Jun. 1999, pp. 111-121.
J Nishioka, Y Hikichi, T Hasegawa, S Nagaya, N. Kashima, K Goto, C Suzuki, T Saitoh, "Development of Bi-2223 Multifilament Tapes for Transposed Segment Conductors", Physica C volumes, 378-381 (2002)1070-1072.
V Hussennether, M Oomen, M Leghissa, H W Neumüller, "DC and AC properties of Bi-2223 Cabled Conductors Designed for High-Current Applications", Physica C 401 (2004) 135-139.
Suzuki et al "Strain Properties of Transposed Segment Conductors for a Transmission Cable", Physica C, vols. 392-396, (2003) pp. 1186-1191.
A P Malozemoff, D T Verebelyi, S Fleshier, D Aized and D Yu "HTS Wire: Status and Prospects", Physica C, vol. 386, (2003), pp. 424-430.

* cited by examiner

*Primary Examiner* — Carl Arbes
(74) *Attorney, Agent, or Firm* — Blank Rome LLP (57) ABSTRACT

Apparatus for forming high temperature superconductor (HTS) continuous conductor elements from a substrate, comprises a punch cutting tool for punching from a continuous strip material at successive operations of the punch cutting tool successive parts of the length of each of a plurality of continuous serpentine conductor elements; a feed system for feeding in steps the continuous strip material through the punch cutting tool between operations of the punch cutting tool; and a plurality of synchronized take-up spools for taking up each of the conductor elements from the punch cutting tool.

27 Claims, 9 Drawing Sheets

APPARATUS FOR FORMING HTS CONTINUOUS CONDUCTOR ELEMENTS

REFERENCE TO PRIOR APPLICATION

This application claims the benefit of U.S. Provisional Application No. 60/871,191, filed Dec. 21, 2006 which is incorporated herein by reference.

FIELD OF INVENTION

The invention relates to an apparatus and method for forming high temperature superconductor (HTS) continuous conductor elements by cutting same from a wider HTS strip substrate.

BACKGROUND

Many applications of high $T_c$ superconductors (HTS), such as power transformers and high current magnets, require higher current than the capacity of presently available conductor tape. High currents can be attained by forming cables of multiple subconductors in which the individual conductors or conductor elements are continuously transposed such that each subconductor is electromagnetically equivalent. In this way current is equally shared and AC losses minimised. A spiral arrangement of conductors on the surface of a cylinder achieves this, but with inefficient use of space so that the overall engineering current density of the winding is reduced. The Roebel bar and Rutherford cable are transposed conductor cable configurations which combine high packing density with rectangular cross-section. The Rutherford cable has been used extensively with low $T_c$ superconductors—see for example, M. N. Wilson, "Superconductors and accelerators: the Good Companions", IEEE Transactions on Applied Superconductivity, Vol. 9, No. 2, June 1999, pages 111-121. The Roebel bar is long established as a high current copper conductor configuration for transformers and has been fabricated using HTS conductor—see J. Nishioka, Y. Hikichi, T. Hasegawa, S. Nagaya, N. Kashirna, K Goto, C Suzuki, T Saitoh, "Development of Bi-2223 multifilament tapes for transposed segment conductors", Physica C volumes, 378-381 (2002) 1070-1072; V Hussennether, M. Oomen, M. Leghissa, H.-W. Neumüller, "DC and AC properties of Bi-2223 cabled conductors designed for high-current applications", Physica C 401 (2004) 135-139; and Suzuki et. al. "Strain properties of transposed segment conductors for a transmission cable", Physica C, volumes 392-396, (2003) pages 1186-1191.

In addition to the requirement for high-current conductor most AC applications of HTS demand low AC loss. In general this means that conductors should be transposed, electrically decoupled, and have minimal transverse dimensions. Because of the typically ribbon-like form of HTS conductors, it may be desirable for AC applications to manufacture conductor with narrower strand width than the usual DC conductor. An application might be, for example, in parts of windings exposed to appreciable AC fields oriented perpendicular to the face of the conductor. This narrow strand conductor will need to be made into a transposed multistrand conductor to give adequate current capacity for many applications. The shorter the transposition twist pitch, the lower the effective interstrand resistivity can be while still keeping the strands magnetically decoupled—see M. N. Wilson, "Superconductors and accelerators: the Good Companions", IEEE Transactions on Applied Superconductivity, Vol. 9, No. 2, June 1999, pages 111-121, equation 3. Provided decoupling is achieved, lower interstrand resistivity improves electrical and thermal stability and facilitates electrical connection to the cable.

There are presently two main HTS tape conductor types in production or development. Multifilament silver or silver alloy-sheathed composite conductor using the superconducting cuprate of composition $(Bi,Pb)_{2.1}Sr_2Ca_2Cu_3O_x$ (otherwise known as Bi-2223) is produced in commercial quantities by a powder-in-tube (PIT) manufacturing process involving drawing, rolling, and thermal treatment processes. A typical conductor will consist of approximately 55 HTS filaments embedded in a silver or silver alloy matrix, will have a cross-section of about 4 mm by 0.2 mm and a critical current at 77 K in self-field of up to 150 A.

Roebel-type cabled conductor made from PIT subconductors has been disclosed in the literature—see J. Nishioka, Y. Hikichi, T. Hasegawa, S. Nagaya, N. Kashima, K Goto, C Suzuki, T Saitoh, "Development of Bi-2223 multifilament tapes for transposed segment conductors", Physica C 378-381 (2002) 1070-1072; and V Hussennether, M. Oomen, M. Leghissa, H.-W. Neumüller, "DC and AC properties of Bi-2223 cabled conductors designed for high-current applications", Physica C 401 (2004) 135-139.

A method for forming Roebel bar cable by controlled bending of tapes of this type is described in U.S. Pat. No. 6,725,071 to C Albrecht, P Kummeth, P Massek, titled "Fully transposed high Tc composite superconductor, method for producing the same and its use". This takes account of the sensitivity of PIT tape to deformation-induced damage by imposing minimum limits on the edge-wise (i.e. in the plane of the tape) bending radius and bending zone length respectively of 100 times and 20 times the tape width. The resulting cable pitch for complete transposition is comparatively long.

"Second generation" or 2G HTS conductor is produced as a thin film of $REBa_2Cu_3O_7$ (examples are RE=Y,Dy,Ho) approximately 1 µm thick on a substrate of a base metal tape coated with various oxide films—see for example A. P. Malozemoff, D. T. Verebelyi, S. Fleshler, D. Aized and D. Yu "HTS Wire: status and prospects", Physica C, volume 386, (2003) pages, 424-430. The HTS layer is subsequently coated with a noble metal such as silver for protection from the atmosphere. Transposed 2G conductor has been disclosed—see Suzuki, Goto, Saitoh and Nakatsuka, "Strain Properties of Transposed Segment Conductors for a Transmission Cable", Physica C 392-396 (2003) 1186-1191. See also Japanese patent application publications 2003092033 and 2004030907.

Methods have been developed for laminating 2G wire with copper tape or electroplating with copper to protect the tape from thermal-electrical instability and, by locating the HTS film at or near the neutral axis for flat-wise (out-of-plane) bending, from mechanical stress. It is envisaged that standard conductor with around 4 mm width will be slit from as manufactured wide conductor. Edge-wise bending of 2G wire to form cables will, like PIT tape, be subject to limits on the minimum bending radius. There is, at present, no published data on the sensitivity of 2G wire to edge-wise bending. However, due to its different mechanical properties compared with silver and silver-alloy sheath material one might expect even more difficulty in edge-wise deformation.

International patent application publication WO05/096322 discloses a method of forming a transposed cable by interleaving a plurality of serpentine conductor elements. Forming conductor elements in a serpentine shape means that the conductor elements, and in particular the HTS film, is subjected to less stress when it is transposed around similar conductor elements.

SUMMARY OF THE INVENTION

According to a first aspect the invention may broadly be said to comprise apparatus for forming high temperature superconductor (HTS) continuous conductor elements from a substrate, comprising:

a punch cutting tool for punching from a continuous substrate at successive operations of the punch cutting tool successive parts of the length of each of a plurality of continuous serpentine conductor elements;

a feed system for feeding in steps the continuous substrate through the punch cutting tool between operations of the punch cutting tool; and a plurality of synchronised take-up spools for taking up each of the conductor elements from the punch cutting tool.

According to a second aspect, the invention may broadly be said to comprise apparatus for forming high temperature superconductor (HTS) continuous conductor elements from a substrate, comprising a punch cutting tool for punching from a continuous substrate at successive operations of the punch cutting tool successive parts of the length of each of a plurality of continuous serpentine conductor elements, and a feed system for feeding in steps the continuous substrate through the punch cutting tool between operations of the punch cutting tool and taking up each of the conductor elements from the punch cutting tool.

According to a third aspect the invention may broadly be said to comprise apparatus for forming high temperature superconductor (HTS) continuous conductor elements from a substrate, comprising a punch cutting tool for punching from a continuous substrate at successive operations of the punch cutting tool successive parts of the length of one or more continuous serpentine conductor elements, and a feed system for feeding in steps the continuous substrate through the punch cutting tool between operations of the punch cutting tool and taking up each of the conductor elements from the punch cutting tool.

Preferably the punch cutting tool is arranged to punch at successive operations, successive parts of the length of a plurality of serpentine conductors side by side from the substrate.

Preferably the punch cutting tool comprises a die for supporting from one side of the substrate at successive operations of the punch cutting tool, successive portions of the continuous substrate for punching by the punch cutting tool, a moving stripper for supporting from an opposite side at said successive operations of the punch cutting tool the successive portions of the substrate, and a moving punch arranged to move through the stripper and portion of the substrate and into the die on each operation of the punch cutting tool.

Preferably the punch cutting tool is arranged to clamp the portion of the substrate between the die and the stripper during each operation of the punch cutting tool, and to move the stripper from the die after each operation of the punch and prior to a feeding step of the feed system to advance a next portion of the substrate between the die and stripper and a corresponding take up step of the take up spools to advance a previously cut part of the conductor elements onto the take up spools.

Preferably the punch cutting tool is arranged to cause the stripper to advance towards the die to clamp the next portion of substrate against the die prior to contact of the punch with that portion of the substrate.

Preferably the stripper is spring mounted such that at the commencement of movement of the punch at each operation of the punch cutting tool but before contact between the punch and the substrate, the stripper contacts the substrate and subsequent movement of the punch towards the substrate causes the stripper to be pressed against the substrate, before the punch contacts the substrate.

Preferably the substrate feed system includes nip rollers on either side of the punch cutting tool arranged to hold the substrate on either side of the punch cutting tool during each operation of the punch cutting tool, and to advance or allow to advance a next portion of the substrate into the punch cutting tool after each operation of the punch cutting tool.

According to a fourth aspect, the invention may broadly be said to comprise a method for forming high temperature superconductor (HTS) continuous conductor elements from a substrate, comprising:

punching from a continuous substrate in each of a series of successive punching operations a part of the length of each of a plurality of continuous serpentine conductor elements;

feeding the continuous substrate through a punch cutting stage between punching operations, in a stepwise fashion; and taking up each of the conductor elements onto a plurality of synchronised take-up spools.

According to a fifth aspect the invention may broadly be said to comprise a method for forming high temperature superconductor (HTS) continuous conductor elements from a substrate, comprising:

punching from a continuous substrate in each of a series of successive punching operations a part of the length of one or more continuous serpentine conductor elements;

feeding the continuous substrate through a punch cutting stage between punching operations, in a stepwise fashion; and taking up each of the conductor elements from the punch cutting tool.

Preferably the method includes punching successive parts of the length of a plurality of serpentine conductors side by side from the substrate.

Preferably the method includes during each punching operation, supporting from one side of the substrate a successive portion of the substrate, moving a stripper to support from an opposite side the portion of the substrate, and moving a punch through the stripper and portion of the substrate and into the die.

Preferably the method includes advancing a next portion of the substrate between the die and stripper and advancing a previously cut part of the conductor elements towards the take up spools, between each operation of the punch.

Preferably the method includes clamping between planar surfaces of the stripper and die all of opposite planar surfaces of the portion of the substrate not cut by the punch.

The term "comprising" as used in this specification means "consisting at least in part of". When interpreting each statement in this specification that includes the term "comprising", features other than that or those prefaced by the term may also be present. Related terms such as "comprise" and "comprises" are to be interpreted in the same manner.

In this specification including claims "conductor elements" and "subconductor" are used interchangeably and refer to the conductor elements or subconductors cut from substrate which are many times longer than they are wide, and typically at least five hundred or more times longer than they are wide. The conductor elements or subconductors also have a length at least ten and typically at least one hundred or more times greater than their individual transposition length. The substrate is preferably HTS coated substrate but may be uncoated substrate which is HTS coated after cutting from the substrate by the apparatus and/or method of the invention.

BRIEF DESCRIPTION OF THE DRAWINGS

A preferred embodiment of the cutting apparatus invention is described by way of example, with reference to the accompanying drawings in which.

DETAILED DESCRIPTION OF PREFERRED FORM

Referring to FIGS. 1 to 4 the preferred embodiment cutting apparatus comprises a supply roll 10, a punch cutting tool 11, and an arrangement of take up spools 12. The apparatus also comprises a user interface panel 13 for user control of the machine.

Figure 1:
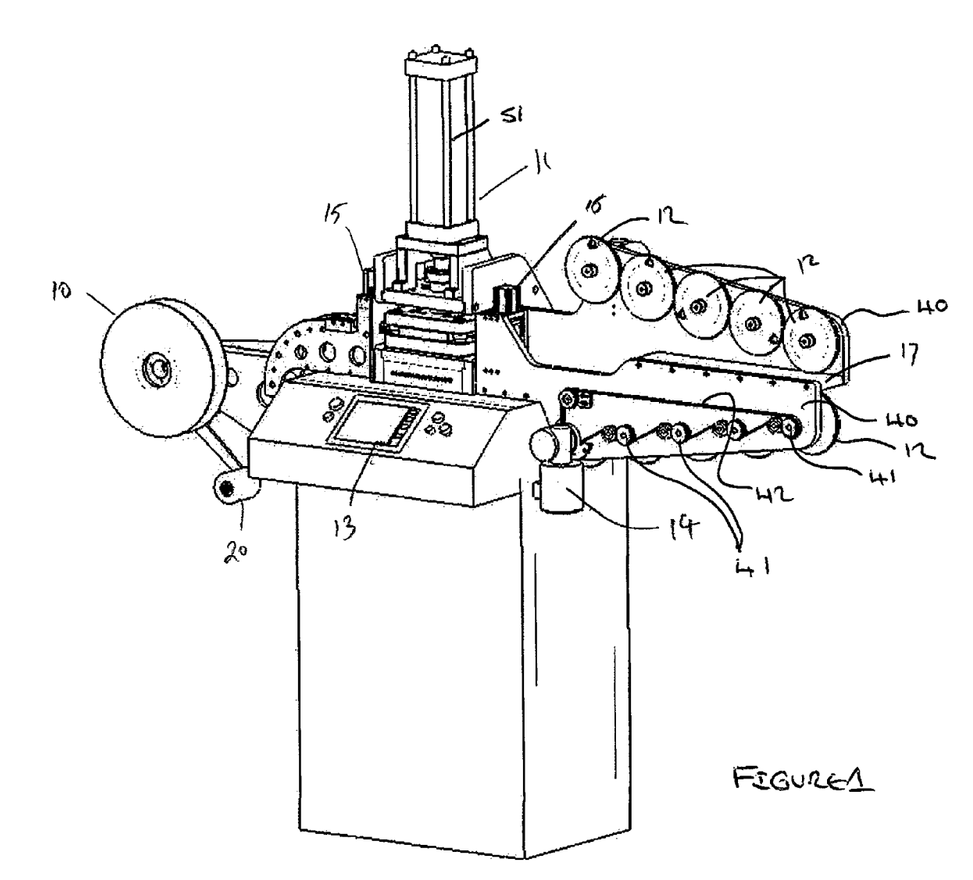
FIG. 1 is a perspective view of the preferred embodiment cutting apparatus for forming HTS continuous conductor elements.
Figure 2:
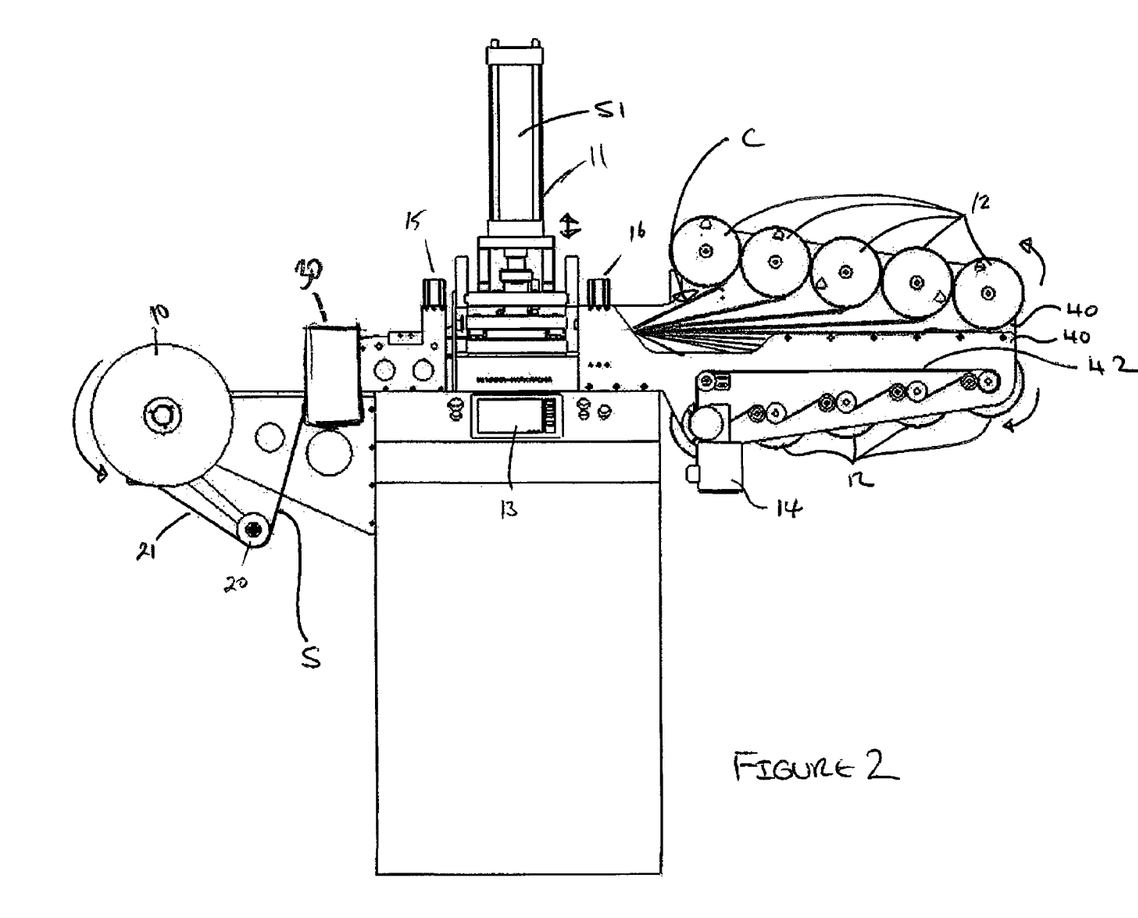
FIG. 2 is a view of the preferred embodiment cutting apparatus from one side.
Figure 3:
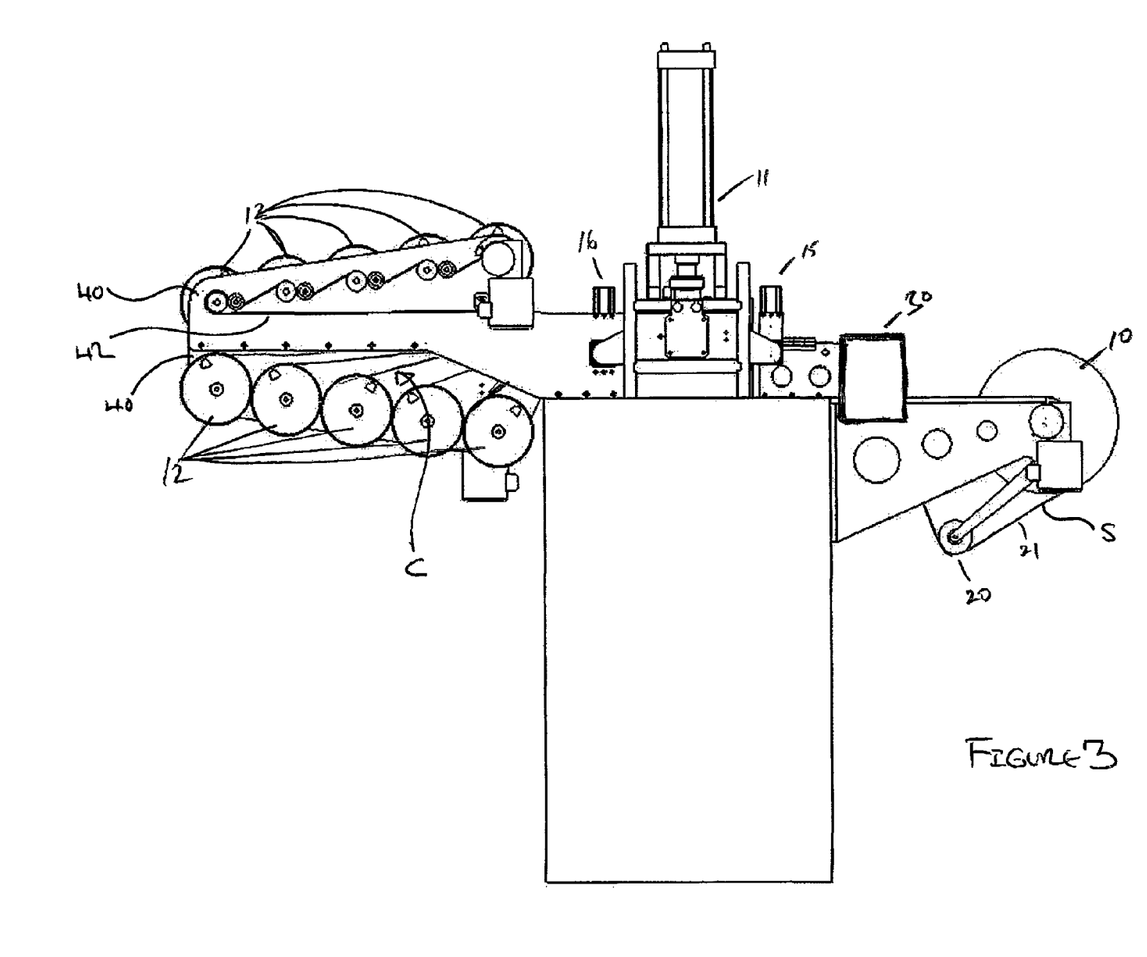
FIG. 3 is a rear view of the preferred embodiment cutting apparatus from the other side.
Figure 4:
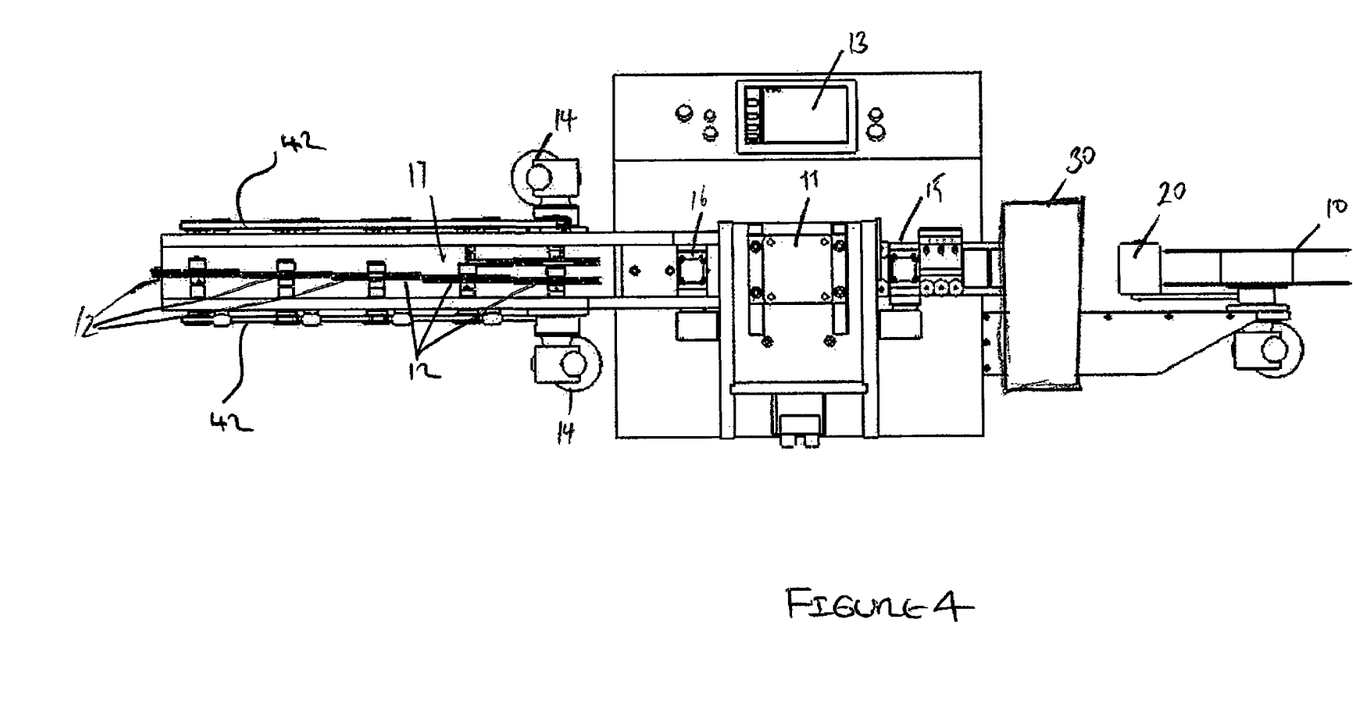
FIG. 4 is a plan view of the preferred embodiment cutting apparatus.

FIGS. 2, 3 and 4 show uncut HTS tape or strip material S (hereinafter HTS strip) from supply roll 10 feeding into the punch cutting tool 11, and multiple individual subconductors C cut from the HTS strip extending from the punch cutting tool 11 to the individual take up spools 12, one for each of the individual continuous conductor elements cut from the substrate.

The supply roll 10 supplies HTS strip in continuous strip form on which there is a layer or thin film of high $T_c$ superconductor material. The HTS layer may, for example, consist of a thin layer of $REBa_2Cu_3O_7$ or other cuprate superconductor which is epitaxially grown on the strip substrate, or other forms of non-epitaxial HTS which may be deposited on buffered base metal substrate tapes. The HTS may be grown on one side or both sides of the substrate.

The substrate consists of a metal tape or strip which may also be coated with single or multiple buffer layers. To create the crystal alignment in the YBCO the metal tape may, for example, be nickel or nickel alloy which is processed both mechanically and thermally to form a tape in which all the crystals are highly aligned. This process is known as rolling assisted biaxial texturing or RABiTS—see A. Goyal et al., "Strengthened, biaxially textured Ni substrate with small alloying additions for coated conductor applications", Physica C, 382 (2002), 251-262. The buffers then transfer the crystal alignment of the substrate through to the superconductor layer. Alternatively the texture may be originated in the buffer layers through "Ion beam assisted deposition" or "Inclined substrate deposition". In ion-beam assisted deposition a sputter deposited film of yttria stabilised zirconia or magnesium oxide is textured by continually bombarding the growing film with $Ar^+$ ions—see Y. Iijima et al., "Reel to reel continuous formation of Y-123 Coated conductors by IBAD and PLD method", IEEE Trans. Appl. Supercon 11, (2001) 2816. In inclined substrate deposition the anisotropy in growth rates for different axes of MgO is exploited to create the crystal alignment—see K. Fujino et al., "Development of RE123 coated conductor by ISD method", Physica C, 392-396, (2003) 815-820. On top of the superconductor layer may be deposited a noble metal cap layer and/or copper stabilisation layer. Two such tapes may be joined "face to face" to form a composite with two superconducting layers in a single element.

The supply roll 10 includes a tensioning arm 20. The tensioning arm 20 ensures that the HTS strip from the supply roll 10 is fed to the punch cutting tool 11 at a consistent tension. The arm 20 is pivotally mounted about the central axis of the supply roll 10. The tension in the HTS strip substrate balances the weight of the arm. If tension in the HTS strip falls, then the weight of the arm 20 causes the arm to fall, thereby re-tensioning the HTS strip feed. The arm may optionally also be spring biased.

Following any such strain hardening stage at 30, the HTS strip is punch cut a short length at a time at each operation of the punch cutting tool 11 to provide a series of continuous serpentine subconductors.

FIG. 2 also shows a strain hardening stage 30. During prior manufacture the HTS strip is typically heated to about 800° C. This tends to soften the substrate making cutting difficult. To counter this the substrate may optionally be strain hardened prior to being punch cut, to reduce ductility of the substrate so resulting in a cleaner cut of the substrate in the punch cutting tool 11. The substrate may be strain hardened by a series of rollers (not shown) at the hardening stage 30 around which the substrate strip passes under tension before entering the punch cutting tool 11 (the diameter of the rollers is not however so small as to avoid damaging the HTS layer by excessive bending). Both sides of the substrate may be passed over rollers several times. Another option for strain hardening the substrate is to bombard the substrate with fine particles on both sides. A further option for hardening the substrate is to electroplate the substrate over the HTS coating one or both sides of the substrate with copper or another metal. A yet further option is to laminate the HTS strip by soldering metal strips to one or both sides, of copper, stainless steel, brass or another metal or metal alloy.

In the preferred embodiment the HTS strip is pulled through the punch cutting tool 11 by the take up rollers 12, with a stepping motion between operations of the punch cutting tool, and is cut into parallel subconductors one transposition length at a time in a stepwise fashion. A transposition length is one complete period of the serpentine shape of the subconductors as is further described with reference to FIG. 9. Each of the resulting individual subconductors is wound on to a separate take up spool 12. In the preferred embodiment the one continuous HTS strip S is cut into ten side by side subconductors C, and ten take up spools 12 are provided. Five take up spools are mounted in series on each of two mounting arms 40. The two sets of take up spools face each other between the mounting arms 40 as shown particularly in FIG. 4. The take up spools are individually aligned with the individual subconductors C leaving the punch cutting tool 11 and are thus each laterally offset from one another so that each spool 12 receives a subconductor without twisting or bending, to reduce stress on the subconductors and avoid damage to the HTS layer. In the preferred embodiment each take up spool 12 is journalled for rotation in its mounting arm 40 by an axle which passes through the mounting arm and to the end of which is mounted a drive pulley 41, on the other side of the mounting arm 40. The take up spools 12 on each mounting arm 40 are driven by a motor 14 via a continuous drive belt 42 passing from the motor 14 around each of the five drive pulleys 41 as shown. Alternatively the take up stage may be driven by a gear drive from motor 14 or via individual indexed stepper motors for example.

Passage of the continuous HTS strip through the punch cutting tool 11 is controlled by a pair of clamps 15 and 16 positioned either (entry and exit) side of the cutting tool. Each comprises a pair of driven nip rollers that holds the portion of the substrate to be or being cut in position in the punch cutting tool 11 during each cutting operation. The nip rollers 15 and 16 are driven by a stepper or servo motor (not shown), and are driven between each operation of the punch cutting tool 11 to draw the HTS substrate through the cutting tool. Operation of this motor(s) driving the rollers 15 and 16 and operation of the punch cutting tool 11 are accurately indexed so that after each operation of the punch cutting tool to cut a length of the subconductors from the HTS strip, then the next length of the HTS strip is driven into position in the punch cutting tool, and is held there during a subsequent cutting operation. Each of the take up spools 12 is clutched so that during each operation of the punch cutting tool 11 while the HTS strip is held stationary by the clamps 15 and 16, the length of the cut subconductors between the punch cutting tool 11 and the take up spools 12 is held under tension (but not excessive strain).

Figure 5:
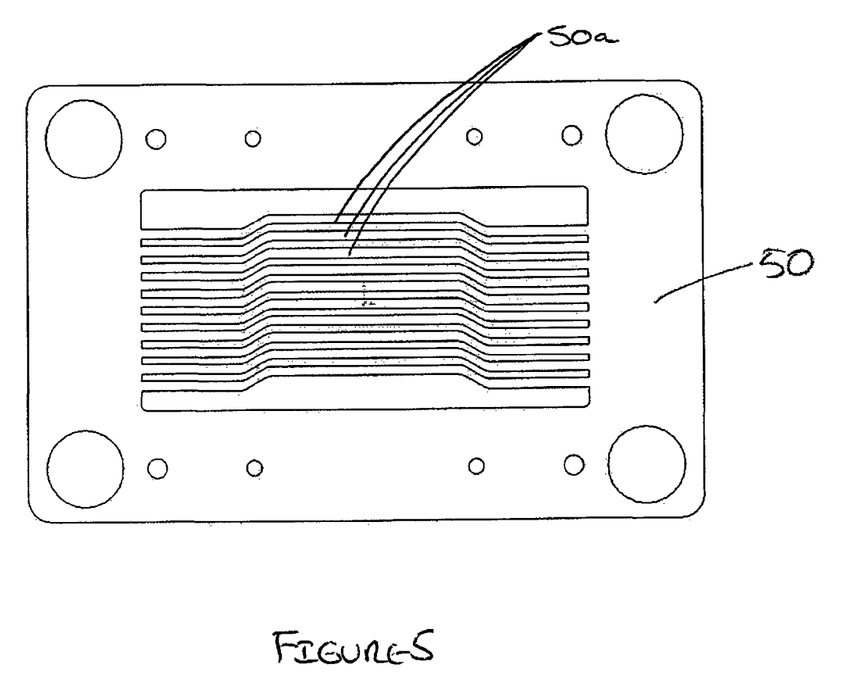
FIG. 5 is a plan view of a die of the punch cutting tool of the preferred embodiment cutting apparatus.
Figure 9:
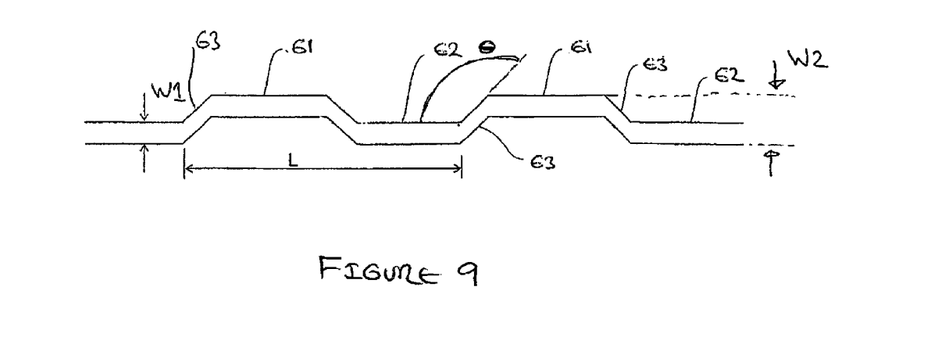
FIG. 9 is a plan view of length of a conductor element produced by the cutting apparatus of FIGS. 1 to 8.

FIG. 9 is a plan view of a short length of subconductor cut in approximately two successive operations of the punch cutting tool comprising the die of FIG. 5. The length of subconductor shown is approximately two transposition lengths long. The serpentine shape of the subconductor enables subsequent winding of a composite Roebel bar or Rutherford cable from a number of such subconductors. A winding method and apparatus for forming Roebel bar or Rutherford cable from a plurality of subconductors as shown in FIG. 9 is described in a co-filed patent application entitled "Apparatus and Method for Producing Composite Cable". The continuous subconductor has alternating relatively long straight portions 61 and 62, with shorter transition or connecting portions 63 between. The cross-over sections 63 may have a sinuous shape (for example with the edges following a sinusoidal path) rather than the straight-sided transitions shown. However, for the same length of cross-over, more sinuous shapes will have a more constricted cross-section and are not favoured on account of the reduced local current carrying capacity. Each subconductor thus comprises a first series of element portions 61 having a generally common longitudinal axis and a second series of element portions 62 having a generally common longitudinal axis that is spaced from the longitudinal axis of said first series of element portions 61 in the plane of the substrate, with the connecting portions 63 between.

The HTS strip from which the subconductors are cut may be provided in any desired width W1 such as 5 cm width for example. For example ten parallel subconductors cut from the substrate strip may have a width of 2 mm, each and a thickness of 50 micrometres to 500 micrometres, with a typical thickness of 100-200 micrometres. The cut subconductors typically have a rectangular or near rectangular cross sectional shape. The preferred embodiment apparatus cuts continuous lengths of such subconductors parallel and side by side from the wider continuous HTS strip substrate.

Figure 10:
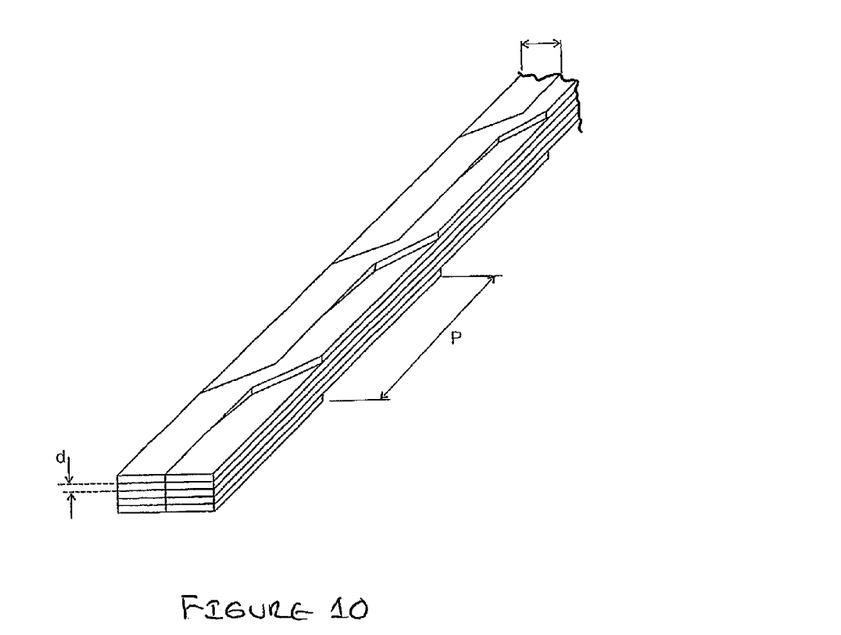
FIGS. 10 and 11 show short lengths of composite cable produced from subconductor elements of the type shown in FIG. 9.

The length L of a single transposition in the example of FIG. 9 may be approximately 92 mm. The width W2 of the subconductor in the example shown is 5 mm. The width W2 must be greater than twice the subconductor width W1, as will be explained with reference to FIG. 10. The angle $\theta$ of the transition sections 63 relative to the straight portions 61, 62 is 150° in the example shown in FIG. 9. This angle represents a compromise between providing as many transpositions per unit length as possible and keeping the cable compact, and acceptable subconductor width W1 in the transition sections 63 and mechanical considerations during winding. In this example, the width W1 in the transition section 63 is Wcos. This is due to the process of punching multiple subconductors side by side from a single substrate, full transposition lengths at a time, to obtain the maximum yield of subconductors for a given width of substrate. It is possible to produce subconductors with transition sections of greater width, but with a reduction in the yield from a given width of substrate.

Figure 6:
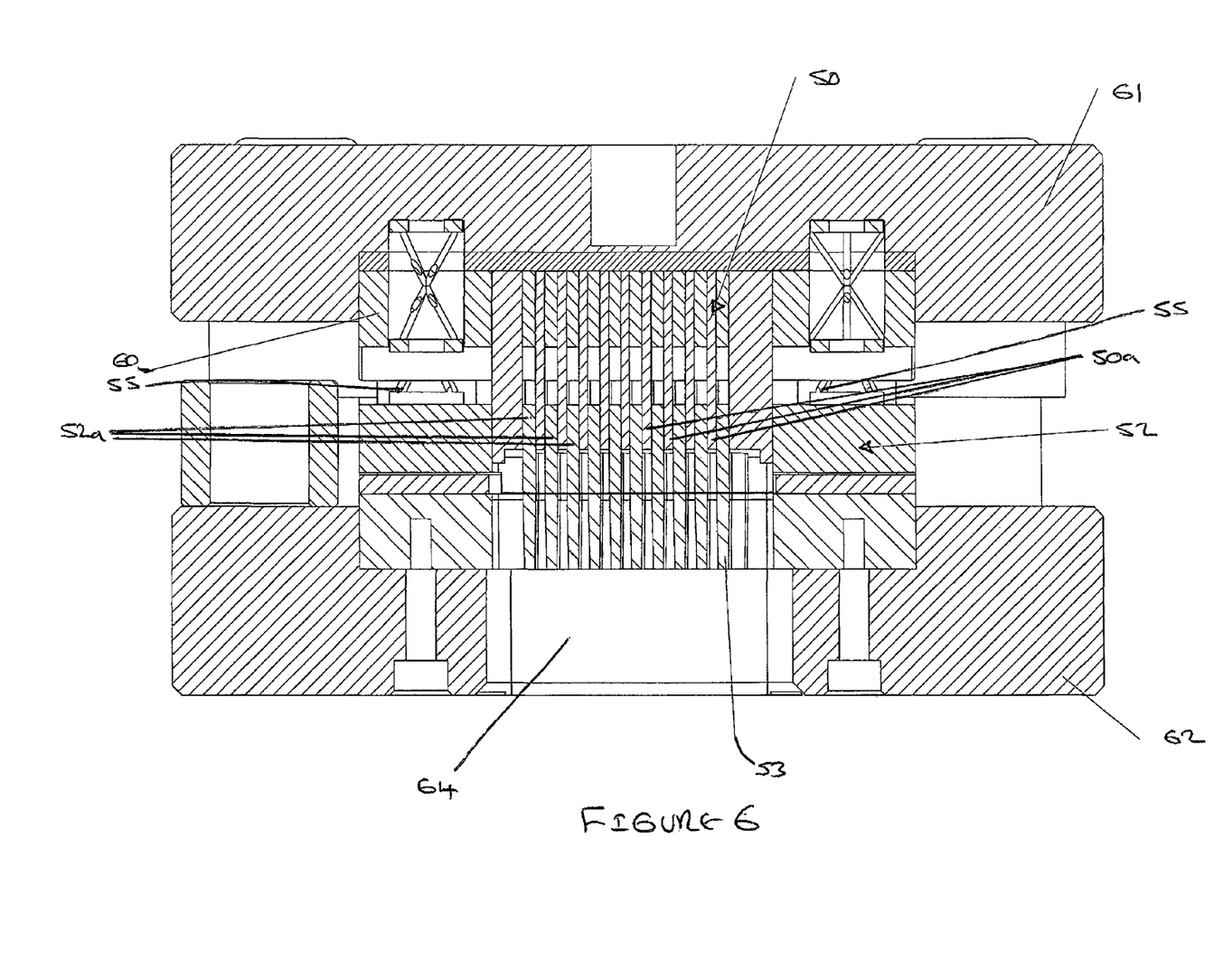
FIG. 6 is a vertical cross-section view through the operative part of the punch cutting tool the preferred embodiment apparatus showing the punch, stripper, and die in their respective positions between operations of the punch cutting tool, with the punch raised and stripper separated from the die.
Figure 7:
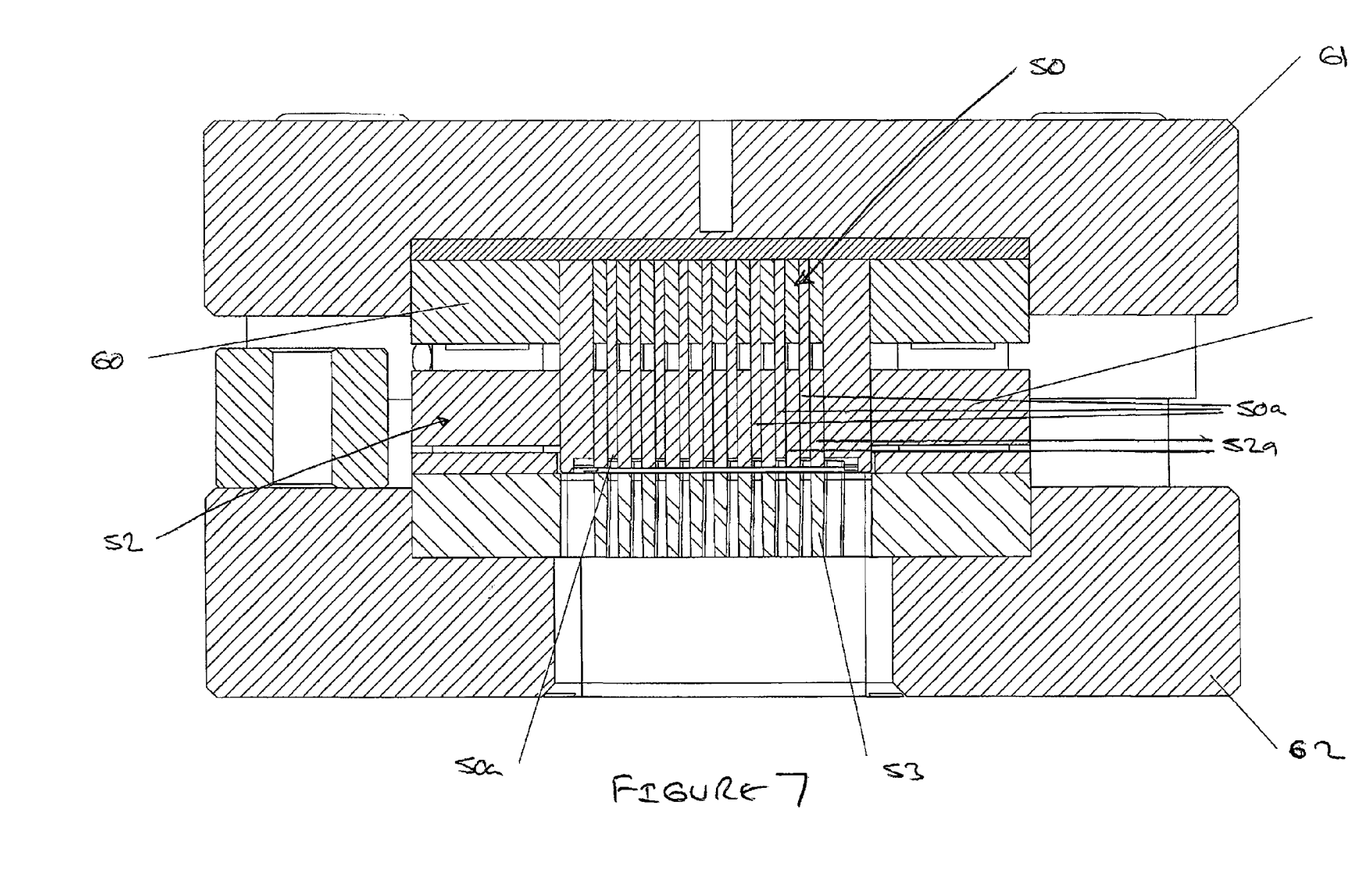
FIG. 7 is a similar cross-section view to FIG. 6a but showing the stripper pressed against a portion of substrate to clamp the substrate portion to the dye, but before contact of the punch with the substrate.
Figure 8:
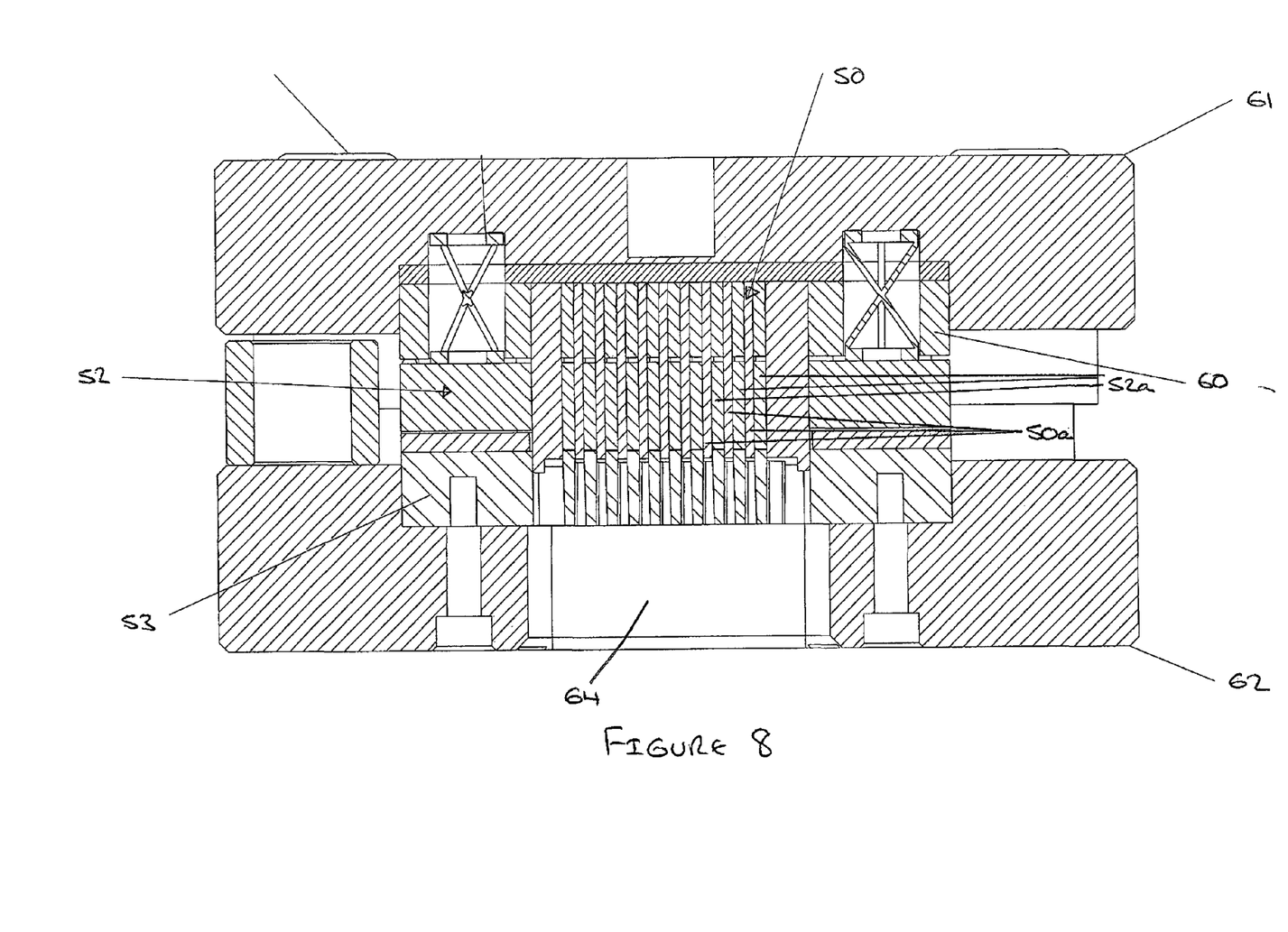
FIG. 8 is a similar cross-section view but showing the die in it's lowermost position after movement to penetrate to cut and penetrate through the substrate portion.

Referring mainly to FIGS. 6, 7, & 8, the punch cutting tool 11 includes a finger-like punch 50, comprising a thick plate of multiple individual parallel cutting elements 50a which form a comb-like structure. The punch 50 is mounted on a hydraulic or pneumatic ram or other actuator 51 via a punch carrier 60 and a bolster 61. In operation the finger-like cutting elements 50a of the punch pass through corresponding longitudinal apertures in stripper 52, through the HTS substrate portion being cut, and into corresponding longitudinal apertures in die 53. FIG. 5 shows in plan one example of such a die. The die is mounted in bottom bolster 62. The stripper 52 is also plate-like in formation, of approximately the same size and shape as the die. Similar finger-like elements 52a define the apertures in the stripper 52 through which the punch elements 50a pass. Preferably the clearance between the stripper elements 52a and the punch elements 50a is slightly less than that between the die 53 and the punch elements 50a, to avoid contact between the punch elements 50a and the die. The die 53 shown in FIG. 5 is used to cut ten parallel subconductor lengths simultaneously. In the preferred form the operative face of the punch, comprising collectively the bottom faces of each of the parallel elements 50a, extends at an angle in the range 1°-5° to the operative surface of the die. The length of the operative cutting element 50a of the punch 50 and of the corresponding apertures in the stripper 52 and die 53, corresponds to one complete transposition length L of the subconductor (see FIG. 9). The HTS strip is preferably fed into the punch cutting tool so that the HTS layer is contacted by the punch first.

During each cutting operation of the punch 50 the die 53 supports the portion of the HTS strip from below, and the stripper 52 carries out the function of stripping cut material from the punch and also most significantly of supporting the HTS strip from above (opposite side) and clamping it against the die 53. The punch 50 cuts through a portion of the HTS strip at each operation, and pushes scrap portions of the substrate cut from between the remaining portions of the HTS strip which become parts of each continuous subconductor, through corresponding longitudinal cavities in the die 53, to fall clear through aperture 64 in the bottom bolster 62. The stripper 52 holds those parallel serpentine portions of the HTS strip portion which become parts of the length of the multiple individual the subconductors. The stripper 52 clamps these portions of the HTS strip between the stripper 52 and the die 53 under pressure, to prevent damage to them during operation of the punch, and particularly to ensure a clean cut and prevent edge damage to the HTS strip including in particular the HTS film thereof. In the preferred form the stripper 52 and die 50 have planar co-operating surfaces which clamp between them the opposite flat surfaces of the strip substrate over all of the surface of the portion of the substrate cut in each operation of the punch.

FIG. 6 shows the punch 50 and stripper 52 raised from the die 53, between punch cutting steps. Between each punch cutting step, while the punch 50 and stripper 52 are in this position, the nip rollers 15 and 16 operate to allow the motors 14 through the take up spools 12 to draw forward the transposition lengths of subconductor just cut in the immediately previous punch cutting operation, and to simultaneously draw the next portion of uncut HTS strip forward to between the punch, stripper and die. The nip rollers 15 and 16 stop after each such step forward, to then hold the portion of the HTS strip just drawn between the punch and die in position (against further lengthwise movement). The motors 14 which drive the take up spools 12 may continue to operate but a slipper clutch associated with each take up spool 12 operates to hold each individual subconductor strand under tension. The punch 50 and stripper 52 then begin to descend together in the direction of arrow A in FIG. 7. Prior to the punch cutting elements 50a contacting the HTS strip portion the stripper 52 is pressed against the upper surface of the HTS strip. The stripper 52 is spring mounted to the punch 53 by springs 55 such that at the commencement of each operation of the punch 50 but before contact with the HTS strip, the stripper 52 contacts the HTS strip, and further movement of the punch 50 towards the HTS strip causes the springs 55 to compress and press the stripper 52 against the HTS strip with increased pressure, before the punch cutting elements 50a next contact the HTS strip, as shown in FIG. 7. Finally as shown in FIG. 8, the punch cutting elements 50a move through the stripper 52 and through the HTS strip portion held between the stripper 52 and die 53 into the corresponding apertures in the die, to cut and remove the HTS strip material between the lengths of the subconductors thus formed. Subsequently the punch 50 and stripper 52 are raised in the direction of arrow B back to the position of FIG. 6, and the feed system operates to advance the next portion of the HTS strip between the punch and die, and the take up rollers 12 advance a further step. The sequence of operations is repeated successively to cut the HTS strip substrate into multiple continuous subconductors a step at a time.

In the preferred form described above the length of the punch, stripper and die in the machine direction is such that one transposition length L of each of ten subconductors is cut from the HTS strip in each operation of the punch cutting tool. Alternatively the punch, stripper, and die may cut longer lengths in each operation such as two transposition unit lengths for example, of more or less than ten subconductors (including though less preferably a single subconductor).

Figure 11:
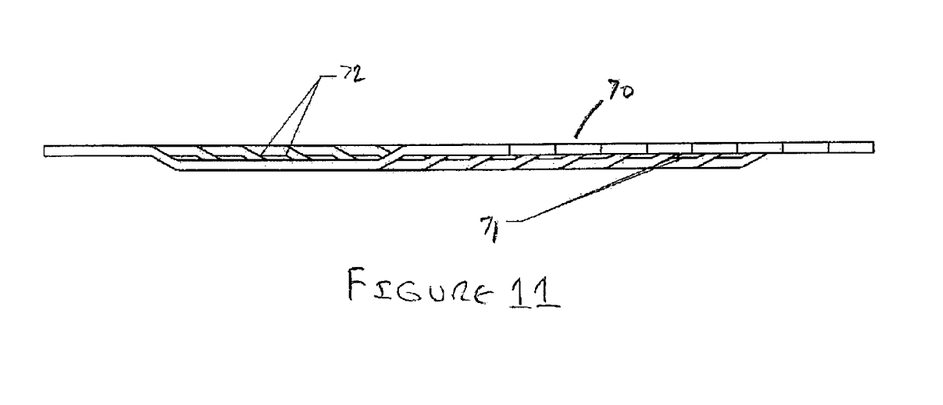

FIG. 11 shows a short length of Roebel cable 70 formed from ten subconductors of the type shown in FIG. 9. The Roebel cable comprises ten substantially identical, serpentine conductors wound around each other. There are gaps between the subconductors in the finished cable 70.

A first gap 71, called the "side clearance" is between parallel straight sections 61, 62. In this example the side clearance is 1 mm. The side clearance is required to allow the subconductors to move laterally relative to each other during a winding process. This lateral movement ultimately means less bending and flexing of the cable is required and so it minimizes stress on the subconductors and crucially the HTS layer.

A second gap 72, called the "transposition clearance", is provided between adjacent transition sections. The transposition clearance allows for pitch errors in the subconductors and provides clearance between the subconductors to enable winding.

The foregoing describes the invention including a preferred thereof so alterations and modifications as will be obvious to those skilled in the art are intended to be incorporated within the scope hereof as defined in the accompanying claims.

The invention claimed is:

1. Apparatus for forming high temperature superconductor (HTS) continuous conductor elements from a substrate, comprising:
   a punch cutting tool for punching from a continuous strip material at successive operations of the punch cutting tool successive parts of the length of each of a plurality of continuous serpentine conductor elements side by side from the strip material, the punch cutting tool comprising a die for supporting from one side of the strip material at successive operations of the punch cutting tool, successive portions of the continuous strip material for punching by the punch cutting tool, a moving stripper also for supporting from an opposite side at said successive operations of the punch cutting tool the successive portions of the strip material, and a moving punch arranged to move through the stripper and portion of the strip material and into the die on each operation of the punch cutting tool;
   a feed system for feeding in steps the continuous strip material through the punch cutting tool between operations of the punch cutting tool; and
   a plurality of synchronised take-up spools for taking up each of the conductor elements from the punch cutting tool.

2. Apparatus according to claim 1 wherein the punch cutting tool is arranged to clamp the portion of the strip material between the die and the stripper during each operation of the punch cutting tool, and to move the stripper from the die after each operation of the punch and prior to a feeding step of the feed system to advance a next portion of the strip material between the die and stripper and a corresponding take up step of the take up spools to advance a previously cut part of the conductor elements onto the take up spools.

3. Apparatus according to claim 2 wherein the punch cutting tool is arranged to cause the stripper to advance towards the die to clamp the next portion of strip material against the die prior to contact of the punch with that portion of the strip material.

4. Apparatus according to claim 3 wherein the stripper is spring mounted such that at the commencement of movement of the punch at each operation of the punch cutting tool but before contact between the punch and the strip material, the stripper contacts the strip material and subsequent movement of the punch towards the strip material causes the stripper to be pressed against the strip material, before the punch contacts the substrate.

5. Apparatus according to claim 4 wherein the stripper is spring mounted to the punch.

6. Apparatus according to claim 1 wherein at each operation of the punch cutting tool the stripper and die are arranged to clamp between planar surfaces of the stripper and die all of opposite planar surfaces of the portion of the strip material not cut by the punch.

7. Apparatus according to claim 1 wherein the operative face of the punch extends at an angle in the range 1°-5° to the operative surface of the die.

8. Apparatus according to claim 1 wherein the feed system includes nip rollers on either side of the punch cutting tool arranged to hold the strip material on either side of the punch cutting tool during each operation of the punch cutting tool, and to advance or allow to advance a next portion of the strip material into the punch cutting tool after each operation of the punch cutting tool.

9. Apparatus according to claim 8 including a drive system for the take up spools, arranged to apply controlled tension to the length of the cut conductor elements extending between the punch cutting tool and the take up spools during each punch cutting operation.

10. Apparatus according to claim 9 wherein the drive system for the take up spools is arranged to draw the substrate through the punch cutting tool between operations of the punch cutting tool.

11. Apparatus according to claim 9 wherein the drive system for the take up spools includes a drive motor, and a slipper clutch for each take up spool.

12. Apparatus according to claim 1 further including a strain hardening stage for hardening the strip material prior to punch cutting.

13. Apparatus for forming high temperature superconductor (HTS) continuous conductor elements from a substrate, comprising a punch cutting tool for punching from a continuous substrate at successive operations of the punch cutting tool successive parts of the length of each of a plurality of continuous serpentine conductor elements side by side from the strip material, the punch cutting tool comprising a die for supporting from one side of the strip material at successive operations of the punch cutting tool, successive portions of the continuous strip material for punching by the punch cutting tool, a moving stripper also for supporting from an opposite side at said successive operations of the punch cutting tool the successive portions of the strip material, and a moving punch arranged to move through the stripper and portion of the strip material and into the die on each operation of the punch cutting tool, and a feed system for feeding in steps the continuous substrate through the punch cutting tool between operations of the punch cutting tool and taking up each of the conductor elements from the punch cutting tool.

14. Apparatus according to claim 13 wherein the punch cutting tool is arranged to punch at successive operations, successive parts of the length of a plurality of serpentine conductors side by side from the strip material.

15. Apparatus for forming high temperature superconductor (HTS) continuous conductor elements from a strip material, comprising a punch cutting tool for punching from a continuous strip material at successive operations of the punch cutting tool successive parts of the length of one or more continuous serpentine conductor elements side by side from the strip material, the punch cutting tool comprising a die for supporting from one side of the strip material at successive operations of the punch cutting tool, successive portions of the continuous strip material for punching by the punch cutting tool, a moving stripper also for supporting from an opposite side at said successive operations of the punch cutting tool the successive portions of the strip material, and a moving punch arranged to move through the stripper and portion of the strip material and into the die on each operation of the punch cutting tool, and a feed system for feeding in steps the continuous strip material through the punch cutting tool between operations of the punch cutting tool and taking up each of the conductor elements from the punch cutting tool.

16. Apparatus according to claim 15 wherein at each operation of the punch cutting tool the stripper and die are arranged to clamp between planar surfaces of the stripper and die all of opposite planar surfaces of the portion of the strip material not cut by the punch.

17. Apparatus according to claim 13 or 15 wherein the substrate feed system includes nip rollers on either side of the punch cutting tool arranged to hold the strip material on either side of the punch cutting tool during each operation of the punch cutting tool, and to advance or allow to advance a next portion of the strip material into the punch cutting tool after each operation of the punch cutting tool.

18. Apparatus according to claim 17 wherein the feed system is arranged to apply controlled tension to the length of the cut conductor elements exiting the punch cutting tool during each punch cutting operation.

19. Apparatus for forming high temperature superconductor (HTS) continuous conductor elements from a strip material, comprising a punch cutting tool for punching from a continuous strip material at successive operations of the punch cutting tool successive parts of the length of one or more continuous serpentine conductor elements side by side from the strip material, and a feed system for feeding in steps the continuous strip material through the punch cutting tool between operations of the punch cutting tool and taking up each of the conductor elements from the punch cutting tool, wherein the punch cutting tool comprises a die for supporting from one side of the strip material at successive operations of the punch cutting tool, successive portions of the continuous strip material for punching by the punch cutting tool, a moving stripper for supporting from an opposite side at said successive operations of the punch cutting tool the successive portions of the strip material, and a moving punch arranged to move through the stripper and portion of the strip material and into the die on each operation of the punch cutting tool.

20. Apparatus according to claim 19 wherein the feed system includes a plurality of synchronised take-up spools for taking up each of the conductor elements from the punch cutting tool.

21. Apparatus according to claim 19 wherein the punch cutting tool is arranged to clamp the portion of the strip material between the die and the stripper during each operation of the punch cutting tool, and to move the stripper from the die after each operation of the punch and prior to a feeding step of the feed system to advance a next portion of the strip material between the die and stripper and take up a previously cut part of the conductor elements.

22. Apparatus according to claim 21 wherein the punch cutting tool is arranged to cause the stripper to advance towards the die to clamp the next portion of strip material against the die prior to contact of the punch with that portion of the substrate.

23. Apparatus according to claim 22 wherein the stripper is spring mounted such that at the commencement of movement of the punch at each operation of the punch cutting tool but before contact between the punch and the strip material, the stripper contacts the strip material and subsequent movement of the punch towards the strip material causes the stripper to be pressed against the strip material, before the punch contacts the strip material.

24. Apparatus according to claim 23 wherein the stripper is spring mounted to the punch.

25. Apparatus according to claim 19 wherein at each operation of the punch cutting tool the stripper and die are arranged to clamp between planar surfaces of the stripper and die all of opposite planar surfaces of the portion of the strip material not cut by the punch.

26. Apparatus according to claim 19 wherein the feed system includes nip rollers on either side of the punch cutting tool arranged to hold the strip material on either side of the punch cutting tool during each operation of the punch cutting tool, and to advance or allow to advance a next portion of the strip material into the punch cutting tool after each operation of the punch cutting tool.

27. Apparatus according to claim 26 wherein the feed system is arranged to apply controlled tension to the length of the cut conductor elements exiting the punch cutting tool during each punch cutting operation.

\* \* \* \* \*